United States Patent [19]

Hanagasaki

[11] Patent Number: 5,767,541
[45] Date of Patent: Jun. 16, 1998

[54] SEMICONDUCTOR MEMORY DEVICE WITH FERROELECTRIC CAPACITOR

[75] Inventor: Osamu Hanagasaki, Hamamatsu, Japan

[73] Assignee: Yamaha Corporation, Shizuoka, Japan

[21] Appl. No.: 695,221

[22] Filed: Aug. 6, 1996

[30] Foreign Application Priority Data

Aug. 7, 1995 [JP] Japan .................................. 7-200915

[51] Int. Cl.$^6$ .................................................. H01L 29/76
[52] U.S. Cl. .......................... 257/295; 257/296; 257/300; 257/305; 257/307
[58] Field of Search ........................... 257/295, 296, 257/300, 305, 307

[56] References Cited

PUBLICATIONS

S. Onishi, et al., "A Half–Micron Ferroelectric Memory Cell Technology With Stacked Capacitor Structure", IEDM 94–843, pp. 34.4.1 –34.4.4.

N. Tanabe, et al., "A Ferroelectric Capacitor Over Bit–Line (F–COB) Cell for High Density Nonvolatile Ferroelectric Memories", 1995 Symposium on VLSI Technology Digest of Technical Papers, pp. 123–124.

H. Yoshimori, et al., "Development of Ferroelectric Memory Device", Technical Report of the Institute of Electronics Information and Communication Engineers, SDM93–137, ICD93–131, (1993–11), pp. 61–67.

Primary Examiner—Carl W. Whitehead

[57] ABSTRACT

A method of manufacturing a semiconductor storage device having a plurality of memory cells each having one transistor and one ferroelectric capacitor includes the steps of: forming a transistor; forming a plate line; sequentially laminating three layers including a first conductive film, a ferroelectric layer, and a second conductive layer stacked in this order; and sequentially etching the three layers by using a single etching mask. It is possible to maintain the contact surface between the electrodes and ferroelectric layer of a ferroelectric capacitor clean and the characteristics of the ferroelectric capacitor of the semiconductor storage device can be improved.

16 Claims, 6 Drawing Sheets

SEMICONDUCTOR MEMORY DEVICE WITH FERROELECTRIC CAPACITOR

BACKGROUND OF THE INVENTION a) Field of the Invention

The present invention relates to a semiconductor memory, and more particularly to a semiconductor memory with a ferroelectric capacitor.

b) Description of the Related Art

The types of memories used nowadays are mainly classified into non-volatile memories and volatile memories. A non-volatile memory is a memory whose storage contents are not erased even when a power source is turned off and electric energy is not supplied. Memories of this type are, for example, a flash memory, a magnetic tape, and a magnetic floppy disk.

A volatile memory is a memory whose storage contents are erased when a power source is turned off. Memories of this type are, for example, semiconductor memories including a static random access memory (SRAM) and a dynamic random access memory (DRAM).

A DRAM has a simple memory cell structure of one transistor and one capacitor and can be fabricated at high integration so that it is an important semiconductor memory for use with today's data processing apparatus. A DRAM, however, requires refreshing operation for maintaining its memory. On the contrary, a SRAM comprises more elements than a DRAM, typically six transistors per one memory cell, but does not require refreshing operation. A DRAM and a SRAM are volatile memories so that the power source is required to be maintained on in order to hold the storage contents.

If a ferroelectric capacitor having a ferroelectric layer sandwiched between a pair of electrodes is used as the capacitor of a memory cell of a DRAM structure, it is possible to give the capacitor a memory function. With a polarization property having a memory function, a semiconductor memory having a non-volatile memory function can be fabricated.

FIG. 4A shows an example of an equivalent circuit of a semiconductor memory cell using a ferroelectric capacitor. A memory cell has one transistor Ts and one ferroelectric capacitor CF, and the circuit configuration is generally the same as a general DRAM circuit.

As shown in FIG. 4A, a control terminal of the transistor Ts is connected to a word line, and one input current terminal thereof is connected to a bit line. The other current terminal is connected to one of a pair of electrodes of the ferroelectric capacitor CF. The other electrode of the ferroelectric capacitor CF is connected to a plate line.

As shown in FIG. 4B, in a memory cell array, a plurality of word lines WL are disposed in one direction (horizontal direction) and a plurality of bit lines BL are disposed in another direction (vertical direction) intersecting the word lines, and cross points constitute a matrix pattern. The plate line PL is generally disposed in the same direction as the word lines.

FIGS. 5A and 5B are cross sectional views showing the structures of conventional memory cells using ferroelectric capacitors.

First, the structure of a memory cell shown in FIG. 5A will be described. The surface layer of a semiconductor substrate 51 has an impurity doped well region 52 formed therein. An active region is defined by a field oxide film 53, on the surface of the well region 52.

In this active region, a transistor is formed having a source region 54a, a drain region 54b, and a gate electrode 55 formed on a gate oxide film 53a. An interlevel insulating layer 56 is formed over the whole surface of the substrate, covering the transistor and field oxide film 53.

On the surface of the interlevel insulating layer 56 laminated upon the field oxide film, a ferroelectric capacitor is formed which has a lower electrode wiring layer 58, a ferroelectric layer 59, and an upper electrode 60a. The ferroelectric film of the capacitor may be $PbZr_{1-x}Ti_xO_3$ ($0.3 \leq x \leq 0.6$)(PZT) or the like. This film is generally formed by a sol-gel method.

The ferroelectric substance such as PZT is likely to liberate oxygen and oxidize electrode. Therefore, as the material of the upper electrode 60a and lower electrode wiring layer 58 in contact with the ferroelectric layer, metals resistant to oxidation are used, for example, noble metals such as platinum (Pt) are used.

The lower electrode wiring layer 58 and ferroelectric layer 59 are formed by laminating a conductive film and a ferroelectric film in succession and continuously etching them by using one etching mask. A portion of the Lower electrode wiring layer 58 forms the plate line electrically connecting the lower electrodes under a plurality of ferroelectric capacitors.

After the two layers of the lower electrode wiring layer 58 and ferroelectric layer 59 are patterned, another conductive film is deposited and etched to form the upper electrode 60a.

An interlevel insulating layer 61 is formed covering the ferroelectric capacitor. The upper electrode 60a of the ferroelectric capacitor and the drain region 54b of the transistor are electrically connected by a wiring 62.

The source region 54a of the transistor is connected to the bit line 63.

Next, the structure of a memory cell shown in FIG. 5B will be described. The different points from the memory cell shown in FIG. 5A reside in that the ferroelectric capacitor is formed not over the field oxide film but over the transistor region for improving integration density and that not the lower electrode but the upper electrode is formed by the same wiring layer as the plate line.

Similar to the processes of the memory cell shown in FIG. 5A, the surface layer of a semiconductor substrate 51 has an impurity doped well region 52 formed therein. An active region is defined by a field oxide film 53, on the surface of the well region 52. In this active region, a transistor is formed having a source region 54a, a drain region 54b, and a gate electrode 55 formed on a gate oxide film 53a.

An interlevel insulating layer 56 is formed over the whole surface of the substrate, covering the transistor and field oxide film 53. A lower electrode 58a is formed on the interlevel insulating layer 56 over the transistor region. The lower electrode 58a is electrically connected to the drain region 54b by a conductive plug 57 burying a connection hole formed in the interlevel insulating layer 56.

On the lower electrode 58a, two layers of a ferroelectric layer 59 and a upper electrode wiring layer 60 are formed. These two layers are deposited in succession and etched by using one etching mask.

The upper electrode wiring layer 60 and ferroelectric layer 59 extend in the direction perpendicular to the drawing sheet. The upper electrode wiring layer 60 is used also as the plate line interconnecting the upper electrodes of a plurality of capacitors.

Another interlevel insulating layer 61 covers the ferroelectric capacitor. The source region 54a is connected to the bit line 63 via a connection hole formed in the interlevel insulating layers 56 and 61.

As above, in a conventional memory cell structure, one of the upper and lower electrodes of a ferroelectric capacitor and the plate line are made of the same wiring layer. The electrode is required to be made of oxidation resistant material such as Pt because of reaction with the ferroelectric layer, and therefore the wiring layer is made of the same material such as Pt. In this case, in order to reduce a wiring resistance, it is necessary to form a thick Pt film of about 100 nm thick.

Forming the plate line and electrode is accompanied by etching processes. Pt is essentially hard to be etched and this Pt film is made thicker as described above. Therefore, it takes a long time to etch this film.

One of the upper and lower electrodes of a ferroelectric capacitor and the plate line are made of the same wiring layer, and the other electrode is independently patterned and formed for each memory cell corresponding to its transistor. The wiring layer pattern including one electrode and plate line is different from the other electrode pattern. Therefore, the three layers including the upper and lower electrode layers and ferroelectric layer sandwiched therebetween cannot be patterned at the same time. At least two etching processes are necessary for patterning a ferroelectric capacitor.

During the former of these two etching processes, the contact surface between the ferroelectric layer and one of the upper and lower electrodes is exposed during a resist patterning process or the like. Therefore, the contact surface may be contaminated, the tight contact between the two layers may be degraded, or the polarization property of the ferroelectric capacitor may be adversely affected.

In the memory cell structure shown in FIG. 5B in which a ferroelectric capacitor is laminated over the transistor region, it is required to form the ferroelectric capacitor on an uneven underlying surface.

Since a ferroelectric layer is generally formed by a sol-gel method, its thickness is determined by a thickness of a coat film formed by spin-coating sol solution. The surface of fluid sol solution tends to become flat. Therefore, if the underlying surface is uneven, the film thickness essentially becomes irregular. This variation of film thickness causes a variation of polarization properties of ferroelectric capacitors.

SUMMARY OF THE INVENTION

It is an object of the present invention to provide a semiconductor storage device having a ferroelectric capacitor of good quality and its manufacture method.

According to one aspect of the present invention, there is provided a semiconductor storage device comprising: a substrate with a semiconductor surface a transistor including a gate insulating film formed on the semiconductor surface, a gate electrode formed on the gate insulating film, and a pair of source and drain regions formed in the semiconductor surface sandwiching the gate electrode; a ferroelectric capacitor including a first electrode, a ferroelectric layer, and a second electrode laminated in this order on the substrate, the first electrode, the ferroelectric layer, and the second electrode having the same plan shape; and connection means for electrically connecting one of the first and second electrodes to one of the source and drain regions.

According to another aspect of the present invention, there is provided a semiconductor storage device comprising: a substrate with a surface including a plurality of semiconductor regions and an insulating region surrounding each of the plurality of semiconductor regions; a plurality of transistors each formed in each semiconductor region in the substrate surface and having a gate insulating film formed on the substrate surface, a gate electrode formed on the gate insulating film, a pair of a source region and a drain region formed in the semiconductor region at both sides of the gate electrode; a plurality of ferroelectric capacitors formed in a matrix shape each connected to an associated one of the transistors and having a first electrode, a ferroelectric layer, and a second electrode laminated in this order on the substrate surface, the first electrode, the ferroelectric layer, and the second electrode having the same plan shape, and one of the first and second electrodes being connected to one of the source and drain regions; a plate line for connecting the others of the first and second electrodes of the plurality of ferroelectric capacitors for each row; a bit line for connecting the others of the source and drain electrodes of the plurality of transistors for each row; and a word line for connecting the gate electrodes of the plurality of transistors for each column.

The interface between the ferroelectric layer and the first electrode may be flat.

The plate line may be made of the same conductive material as the gate electrode, and formed directly on the insulating region on the substrate surface to interconnect the first electrodes of the plurality of capacitors.

According to a further aspect of the present invention, there is provided a method of manufacturing a semiconductor storage device comprising the steps of: preparing transistor on the semiconductor surface, the transistor having a source region, a drain region, and a gate electrode; forming an interlevel insulating layer covering the transistor; sequentially laminating on the interlevel insulating layer three layers including a first conductive film, a ferroelectric layer, and a second conductive layer laminated in this order; sequentially etching the three layers by using the same etching mask to pattern a ferroelectric capacitor having the first electrode, the ferroelectric layer, and the second electrode; and electrically connecting the second electrode and the drain region together.

The step of forming the transistor may comprise the steps of: forming a conductive film on the substrate; selectively etching the conductive film to pattern a wiring layer and the gate electrode; doping impurities in the semiconductor surface at both sides of the plurality of gate electrodes by using the plurality of gate electrodes as a mask to form a plurality of source and drain regions; forming a connection hole in the interlevel insulating layer for each transistor to expose a partial surface area of the patterned wiring layer, and forming a conductive plug burying the connection hole, after the step of forming the interlevel insulating layer and before the laminating step, the laminating step may comprise the step of forming the first conductive film directly contacting the upper surface of the conductive plug, and the step of patterning the ferroelectric capacitor may form each ferroelectric capacitor connected to each conductive plug on the region including the upper surface of the conductive plug.

The method may further comprises the step of planarizing the upper surface of the conductive plug and the surface of the interlevel insulating layer after the step of forming the conductive plug and before the laminating step.

According to a still further aspect of the present invention, there is provided a method of manufacturing a semiconductor storage device comprising the steps of: preparing a substrate with a semiconductor surface; forming a transistor on the semiconductor surface, the transistor having a source region, a drain region, and a gate electrode; forming an interlevel insulating layer covering the transistor; forming a connection hole in the interlevel insulating layer for exposing a partial surface area of the drain region and forming a conductive plug burying the connection hole; sequentially laminating, on the upper surface of the conductive plug and on the interlevel insulating layer, three layers including a first conductive film, a ferroelectric layer, and a second conductive layer laminated in this order; and sequentially etching the three layers by using the same etching mask to pattern, on a region including the upper surface of the conductive plug, a ferroelectric capacitor having the first electrode, the ferroelectric layer, and the second electrode.

The method may further comprise the step of planarizing the upper surface of the conductive plug and the surface of the interlevel insulating layer after the step of forming the conductive plug and before the laminating step.

If the three layers of a pair of electrodes and a ferroelectric layer constituting the ferroelectric capacitor are made to have the same plan shape, these three layers can be successively etched by using a single etching mask. The interfaces between respective layers of the ferroelectric capacitor are not exposed during the resist film patterning process or etching process, and so the clean surface is maintained. Therefore, a good adhesive force at each interface can be retained and the polarization property of the ferroelectric capacitor can be prevented from being degraded by contamination of each interface.

If a ferroelectric capacitor is formed on a planarized interlevel insulating film, since the underlying surface is not irregular, the thickness of the ferroelectric layer formed even by a sol-gel method is made uniform. Fluctuation of the characteristics of a ferroelectric capacitor to be otherwise caused by irregular film thickness can be avoided.

If the common conductive film is patterned to form the transistor gate electrode and the plate line, the film forming process and photolithography process can be simplified.

As above, by sequentially etching the three layers of a pair of electrodes and a ferroelectric layer constituting the ferroelectric capacitor by using the same etching mask, the interface between the ferroelectric layer and upper and lower electrodes can be maintained clean. Accordingly, a good adhesive force at each interface can be retained and the polarization property can be prevented from being degraded.

Further, by planarizing the surface of the interlevel insulating layer on which the ferroelectric capacitor is formed, the thickness of the ferroelectric layer can be made uniform and the characteristics of the ferroelectric capacitor can be made stable.

DETAILED DESCRIPTION OF THE PREFERRED EMBODIMENTS

The manufacture processes of a memory cell according to the first embodiment will be described.

Figure 1A:
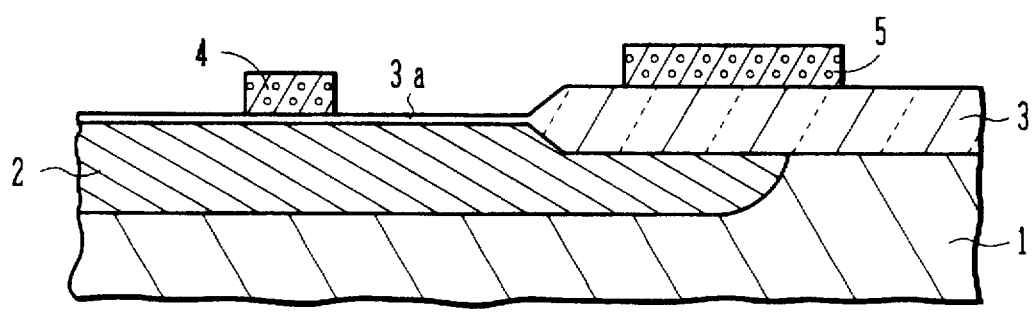
FIGS. 1A to 1H are cross sectional views of a memory cell illustrating main processes of a manufacture method of a semiconductor storage device according to a first embodiment of the invention.

With reference to FIG. 1A, the processes of forming a gate oxide film and a plate line on a semiconductor substrate will be described first. The processes up to this are similar to the manufacture processes of general metal oxide semiconductor (MOS) technology. In this embodiment, an n-channel MOS transistor is formed by way of example.

First, on the surface of an n-type Si substrate 1, an oxide film is formed by thermal oxidation. On this oxide film, a resist film is formed with a spinner by spin coating. After the exposure and development processes, a resist pattern is formed (in the following, patterning a resist film is performed in the similar manner as above).

By using this resist pattern as an etching mask, the oxide film on the surface of the substrate is etched. By using this oxide film pattern and the resist pattern remaining thereon as an ion implantation mask, ions for imparting p-type conductivity, e.g., B ions, are implanted. The ion implantation conditions are an acceleration energy of 30 keV and an ion dose of $1.5 \times 10^{13}$ cm$^{-2}$.

The remaining resist pattern is removed. The B ion implanted layer is subjected to a heat treatment to form a p-type well 2.

Thereafter, the oxide film on the substrate surface is completely etched and removed. The surface of the semiconductor substrate 1 is again thermally oxidized to form a thin oxide film of about 10 nm thick. A silicon nitride film of about 140 nm thick is formed over the whole surface of the substrate 1 by thermal chemical vapor deposition (CVD).

On the surface of the silicon nitride film, a resist pattern is formed which has an opening for exposing the surface of the silicon nitride film where a field oxide film is to be formed.

By using this resist pattern as an etching mask, the silicon nitride film is dry etched by using etching gas of $CF_4$ to form a silicon nitride film pattern covering only the active regions. The remaining resist pattern is thereafter removed.

By using this silicon nitride film pattern as an oxidation resistant mask, thermal oxidation is performed at about 1100° C. As shown in FIG. 1A, a field oxide film 3 of about 400 nm thick is therefore formed which defines the active regions where a transistor is formed. Thereafter, the remaining silicon nitride pattern is etched and removed.

Although the thin oxide film left on the active region may be used as a gate oxide film 3a of the transistor, in order to form a gate oxide film of a better quality, the left oxide film is etched and removed together with the silicon nitride film, and a new thermal oxide film of about 10 nm thick is formed on the substrate surface to use it as the gate oxide film 3a.

Next, a gate electrode 4 and a plate line 5 are formed. First, a polysilicon film of about 300 nm thick is formed on the substrate surface by low pressure CVD, under the conditions of $SiH_4$ source gas, an ambient pressure of 0.3 Torr, and a substrate temperature of about 600° C.

In order to impart conductivity to this polysilicon film, n-type impurity phosphorous (P) is doped in this film. If P is doped by ion implantation, the conditions are an acceleration energy of 30 keV and an ion dose of $10^{16}$ cm$^{-2}$. The polysilicon film obtained has a sheet resistivity of about 30 $\Omega$/[ ].

P may be diffused in the polysilicon film by heat treatment in an atmosphere of phosphorous oxychloride ($POCl_3$). The dose of P is set to about $10^{20}$ atoms or ions/cm$^3$.

A resist pattern is formed on the impurity doped polysilicon film. By using this resist pattern as an etching mask, the polysilicon film is etched to form the gate electrode 4 and plate line 5 at the same time.

Since the gate electrode 4 and plate line are made of the same conductive material, the film forming process and photolithography process can be simplified.

Figure 1B:
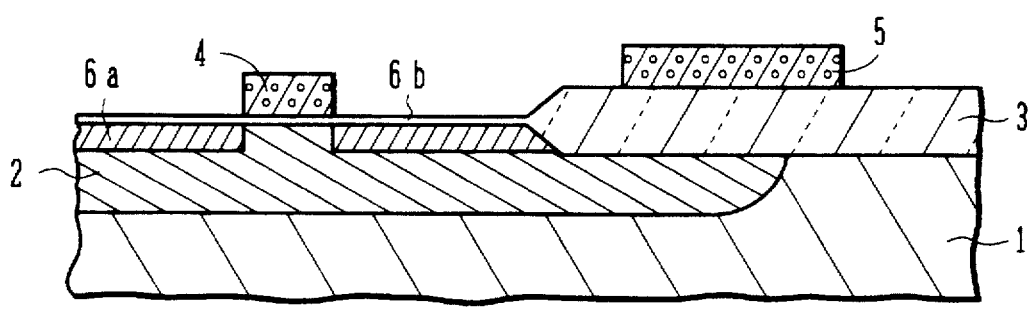

As shown in FIG. 1B, by using the field oxide film 3 and gate electrode as an ion implantation mask, impurity ions are implanted to form a source region 6a and a drain region 6b in each transistor region. For example, arsenic (As) ions are implanted into the surface layer of the substrate under the conditions of an acceleration energy of 80 keV and an ion dose of $5.0 \times 10^{15} cm^{-2}$. Under these ion implantation conditions, As ions penetrate through the thin gate oxide film 3a, but do not penetrate through the thick field oxide film 3 and gate electrode 4.

Thereafter, the substrate is annealed for 30 minutes at 900° C. to activate implanted As ions in the source region 6a and drain region 6b of the transistor.

Figure 1C:
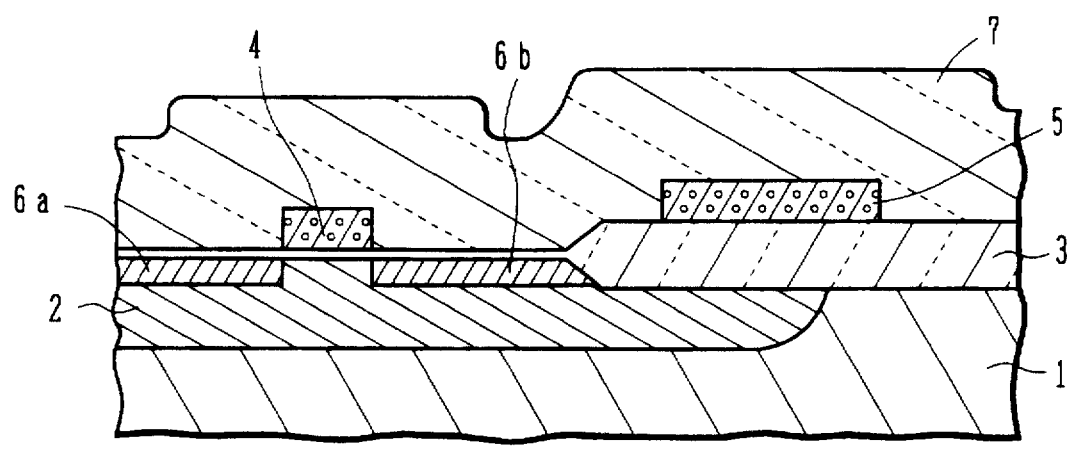

As shown in FIG. 1C, a borophosphosilicate glass (BPSG) film of about 1000 nm thick is deposited by atmospheric pressure CVD to form an interlevel insulating film 7. As shown in FIG. 1C, the surface of the interlevel insulating film 7 is irregular because the irregular surface of the underlying layer is reflected upon.

A resist pattern is formed on the interlevel insulating film 7. By using this resist pattern as an etching mask, the interlevel insulating film 7 is dry etched to form a connection hole exposing a partial area of the plate line 5.

Figure 1D:
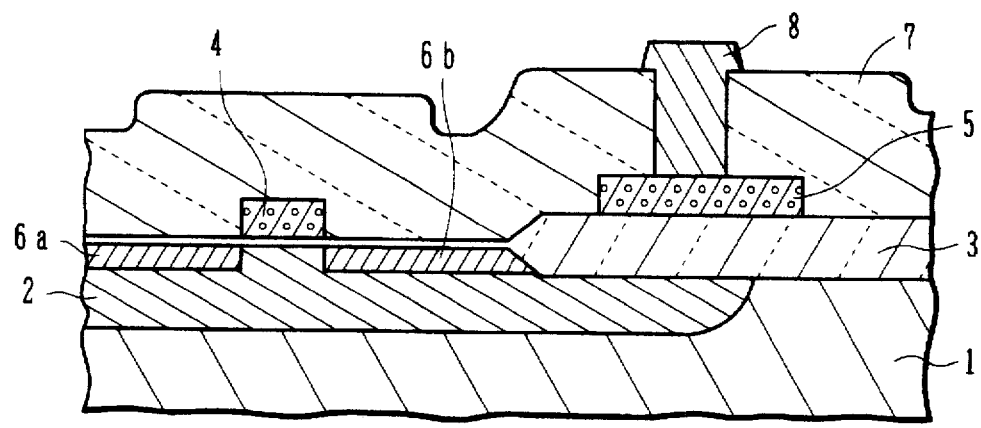

As shown in FIG. 1D, a W plug 8 is formed by selective CVD using reduction reaction of tungsten hexafluoride ($WF_6$), the W plug burying the inside of the connection hole. Tungsten grows only on the surface of conductive material, and does not grow on the surface of insulating material.

Figure 1E:
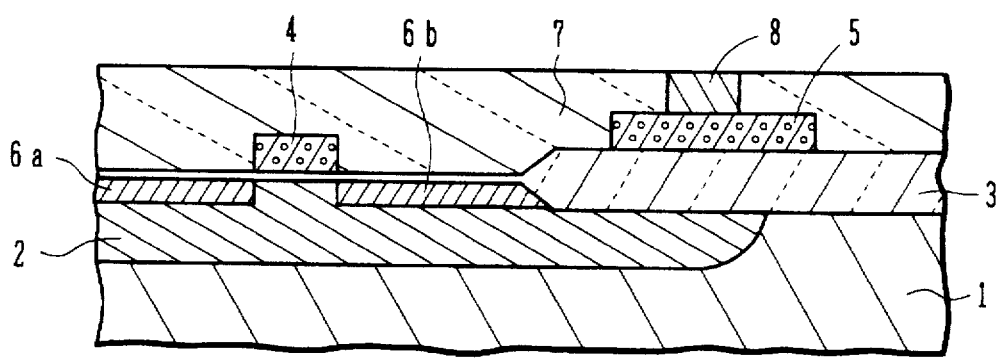

As shown in FIG. 1E, the interlevel insulating film 7 and W plug 8 are lapped off from their surfaces by chemical mechanical polishing (CMP) to remove surface irregularity. For example, they are lapped off about 500 nm deep from the highest surface to obtain generally a planarized surface.

The substrate surface may be planarized by etch-back instead of CMP. For this etch-back method, for example, an SOG film is coated on the substrate surface, and after a flat coated surface is formed because of fluidity of the SOG coat film, the SOG film and underlying layer are etched at the same etching rate from the surface of the SOG film to thereby obtain a flat surface. In this case, the etching continues until the upper surface of the W plug 8 is exposed.

Figure 1F:
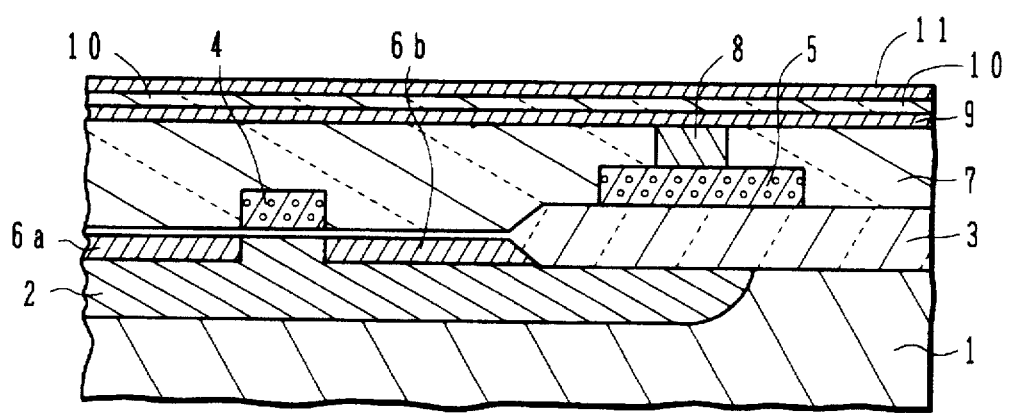

As shown in FIG. 1F, successively laminated on the planarized substrate surface are a Pt film 9 by sputtering, a PZT ($PbZr_{1-x}Ti_xO_3$) film 10 by a sol-gel method, and a Pt film 11 by sputtering.

With the sol-gel method, after sol solution containing precursor is coated, solvent is vaporized by heat to gel the sol solution. Precursor in the sol solution is chemically formed using metal alkoxide or the like. The composition ratio of the formed film can be easily controlled by the amount of metal alkoxide. Since the film can be formed at an atmospheric pressure, a complicated film forming system is unnecessary.

In forming the PZT film, first, sol solution is formed whose solvent contains precursor of PZT, e.g., $Pb(CH_3COO)_2 \cdot 3H_2O$, $Zr(n-OC_4H_9)_4$, and $Ti(i-OC_3H_7)_4$. The sol solution is spin coated on the Pt film 9 with a spinner to form the sol solution layer of about 100 nm thick.

Since the surface of the interlevel insulating film 7 is planar, the surface of the Pt film 9 is also planar. Therefore, the thickness of the sol solution layer coated on the Pt film 9 can be made generally uniform. Thereafter, the sol layer is heated for about 30 seconds at about 600° C. by rapid thermal annealing to gel the sol solution and form the PZT film 10.

The thickness of the Pt film 9 is 20 nm and that of the Pt film 11 is 50 nm. The Pt film 11 is thicker than the Pt film 9 because the Pt film 11 is connected at a later process to a wiring layer and the contact surface of the Pt film 11 is lightly etched to obtain good ohmic contact.

If the electrode of a ferroelectric capacitor and the plate line are made of the same wiring layer as conventional, the Pt film is required to be as thick as about 100 nm to reduce the wiring resistance. In this embodiment, however, since the electrode of a capacitor and the plate line are formed independently from each other, it is not necessary to care about the wiring resistance of the capacitor electrode, and both the upper and lower Pt films can be made 50 nm or thinner.

PZT is likely to liberate oxygen and oxidize electrodes connected thereto. It is therefore preferable to select oxidation resistant noble metal such as Pt as the electrode material of the ferroelectric capacitor, as described earlier. In place of Pt, Au may be used.

Figure 1G:
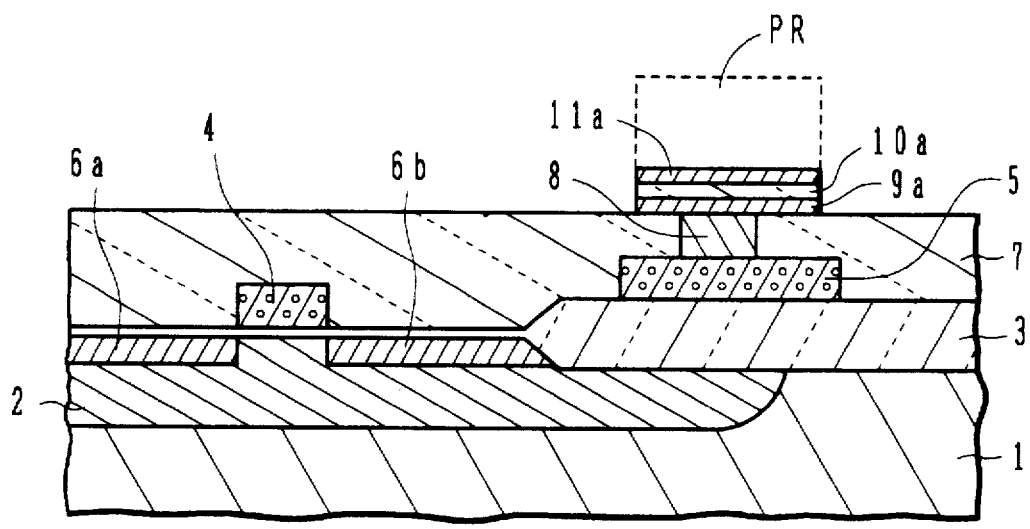

As shown in FIG. 1G, a resist pattern RP is formed on the surface of the Pt film 11. By using this resist pattern RP as a common etching mask, the three laminated layers of Pt film 11, PZT film 10, and Pt film 9 are etched in succession. A ferroelectric capacitor is therefore formed over the W plug, being constituted by a lower electrode 9a, a ferroelectric layer 10a, and upper electrode 11a. The resist pattern RP is thereafter removed.

For etching the three layers, physical etching is preferable, for example, ion milling (ion beam sputtering) using Ar. The ion milling conditions are, for example, an Ar gas pressure of $3 \times 10^{-4}$ Torr, a beam current of 400 mA, and a milling time of 10 minutes. In place of ion milling, reactive ion etching may be used.

Figure 1H:
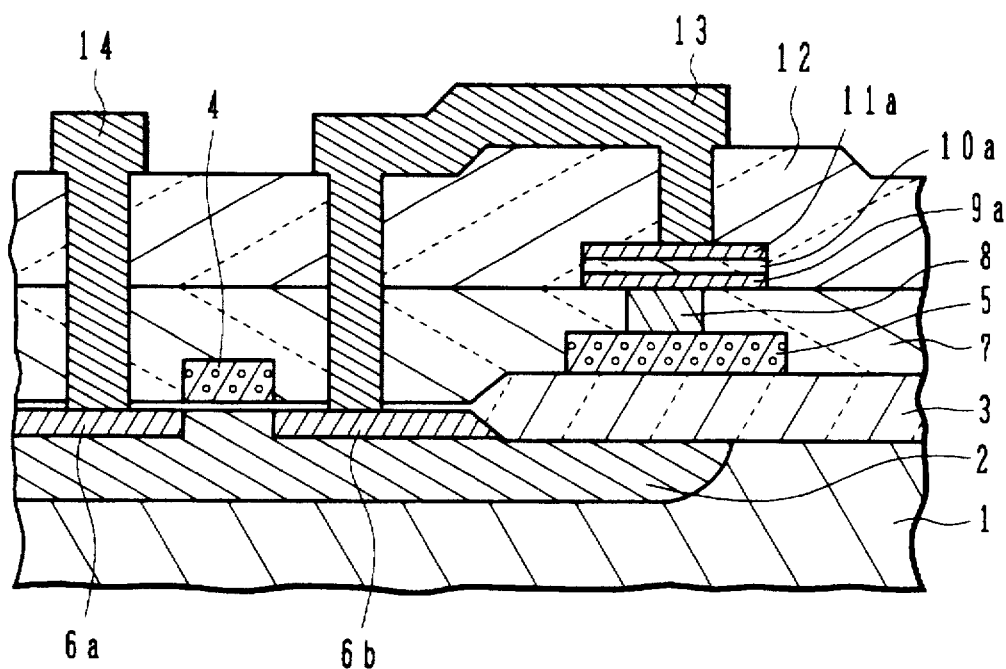

As shown in FIG. 1H, a BPSG film of about 1000 nm thick is formed by atmospheric CVD, covering the ferroelectric capacitor. This BPSG film is another interlevel insulating film 12.

Wiring connection holes are formed in the interlevel insulating film 12 to expose the partial surface areas of the source region 6a and drain region 6b of the transistor and the upper electrode 11a of the ferroelectric capacitor.

In order to obtain good ohmic contact with the wiring, the surface of the upper electrode 11a is lightly etched. Thereafter, a wiring layer is formed by sequentially laminating three Layers of a Ti film by sputtering, a TiN film by reactive sputtering, and an Al layer by sputtering, in this order. The thickness of each layer is, for example, 20 nm of the Ti film, 100 nm of the TiN film, and 1000 nm of the Al film.

A resist pattern is formed on the wiring layer. By using this resist pattern as an etching mask, the wiring layer is etched to form a wiring pattern 13 and a bit line 14.

The bit line 14 is connected to the source region 6a of the transistor. As will be later described with reference to FIG. 2, the portion of the bit line 14 different from the cross sectional area in FIG. 1H extends laterally as viewed in FIG. 1H to interconnect the source regions of a plurality of transistors. The drain regions 6b is connected to the upper electrode 11a of the ferroelectric capacitor by the wiring pattern 13.

With the above processes, a memory cell is completed. On the Si substrate 1, a number of memory cells are being formed in an array.

Figure 2:
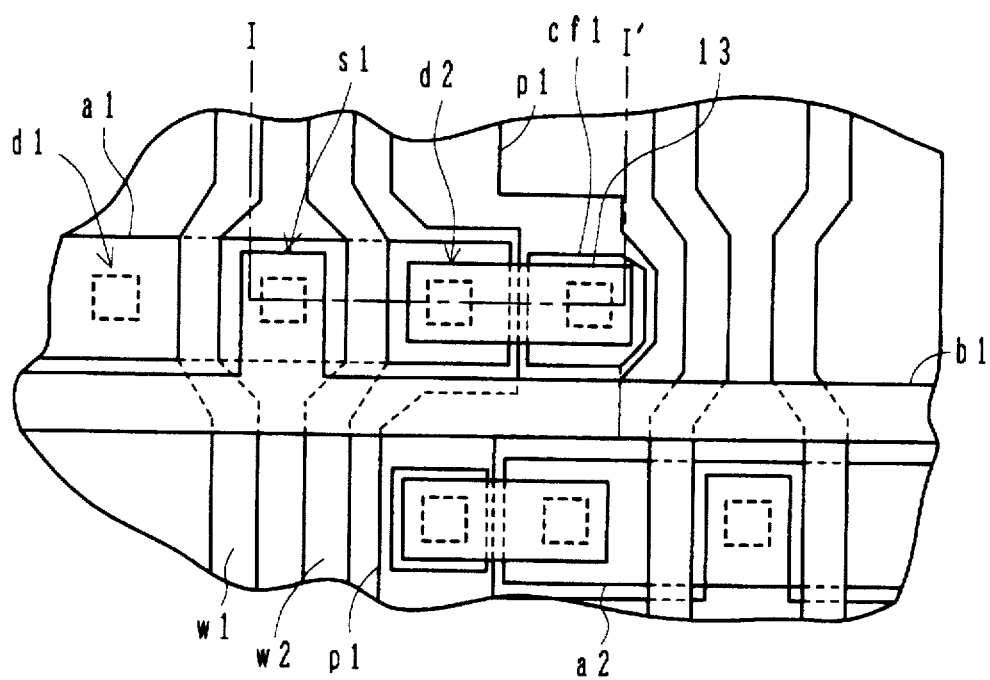
FIG. 2 is a plan view of a memory cell array according to the first embodiment of the invention.
Figure 4A:
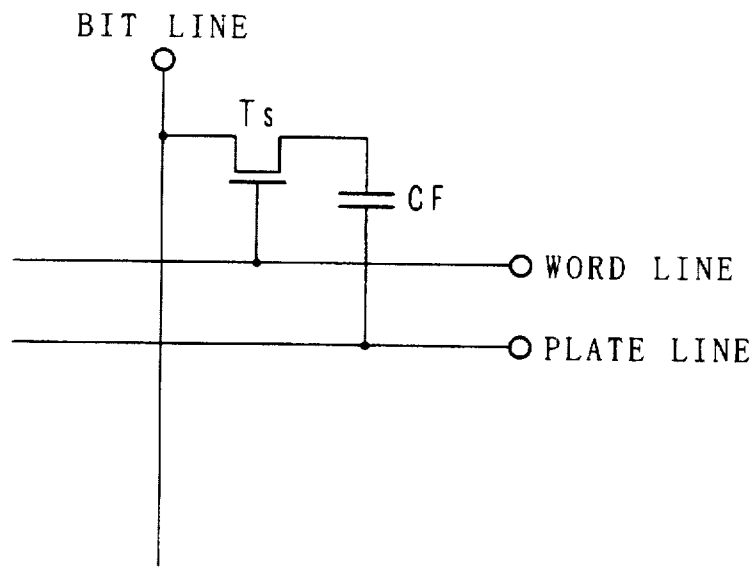
FIG. 4A and 4B are circuit diagrams of a memory cell and a memory matrix.
Figure 4B:
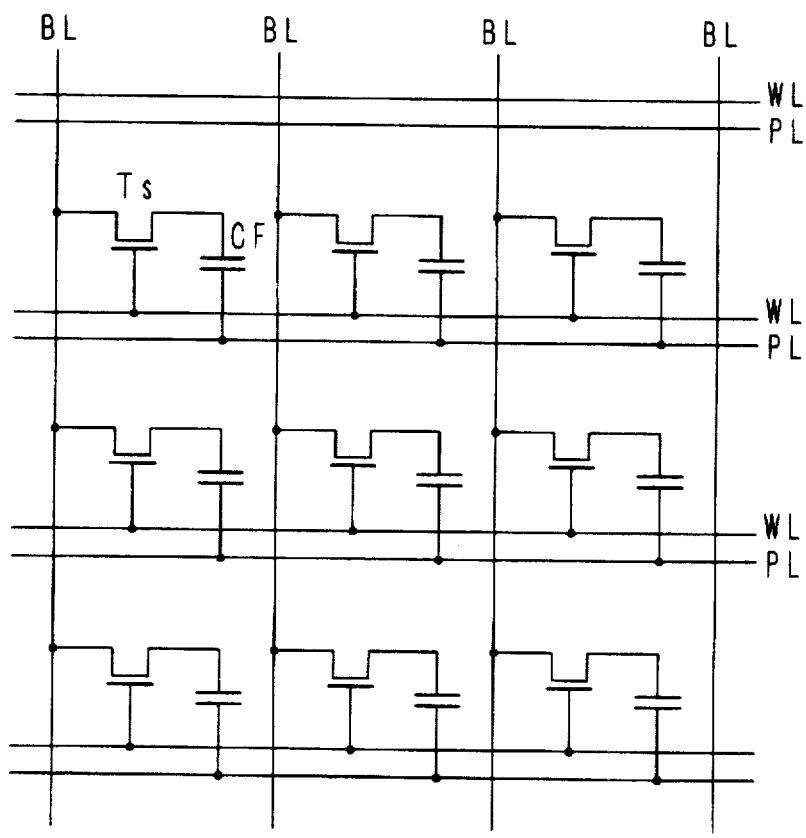
Figure 5A:
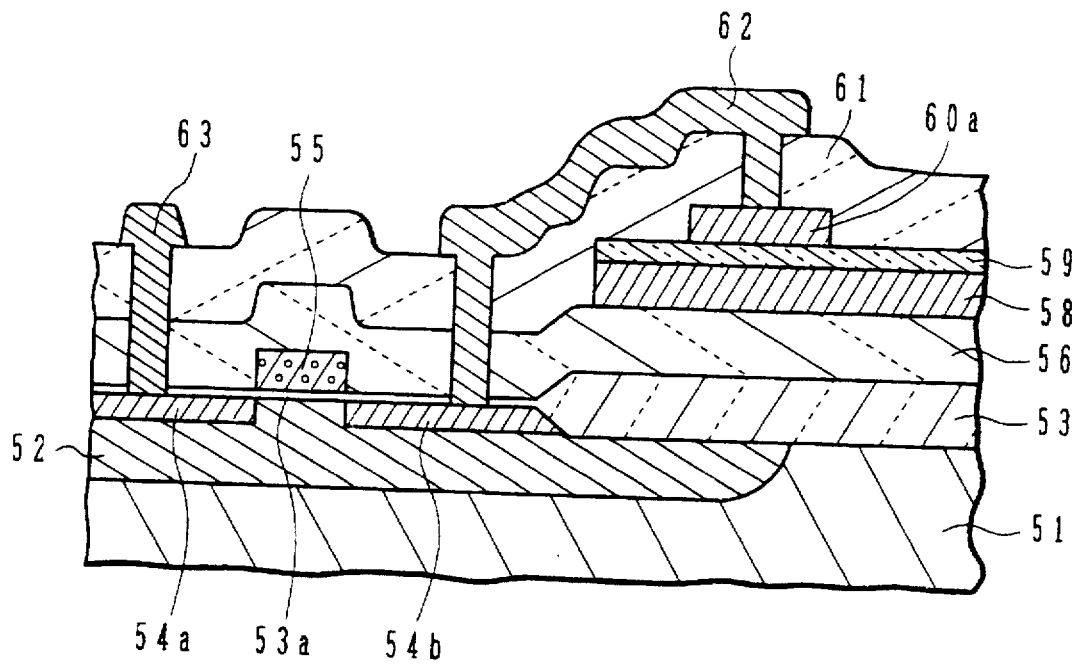
FIGS. 5A and 5B are cross sectional views of conventional two types of memory cells.
Figure 5B:
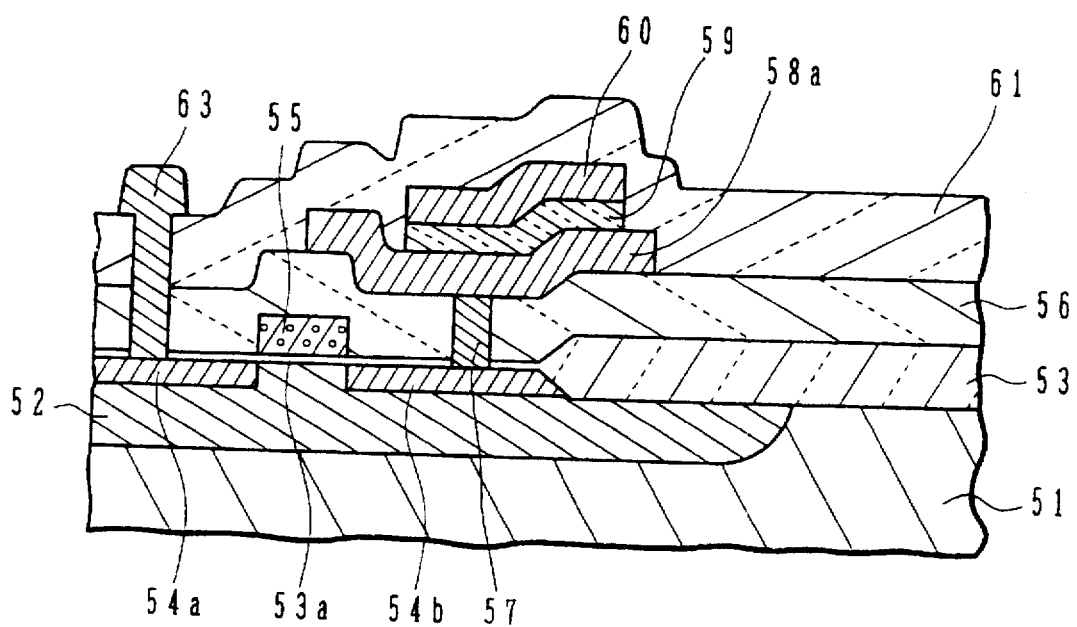

FIG. 2 shows an example of a layout of a memory cell array formed on a semiconductor substrate. The memory cell array forms a memory circuit as shown in FIG. 4B.

Each memory cell includes one transistor and one ferroelectric capacitor. The plane taken along one-dot chain line I—I' in FIG. 2 corresponds to the cross sectional view of the memory cell shown in FIG. 1H.

Active regions a1 and a2 are defined by the field oxide film. A source region s1 is disposed at the center of the active region a1, and drain regions d1 and d2 are disposed at the right and left sides of the source region s1 with gate electrodes w1 and w2 being interposed therebetween. Namely, in the active region a1, two transistors having the common central source region s1 are formed. The source region s1 is connected via the bit line b1 to the source regions of a plurality of other transistors.

In the regions at the right and left areas as viewed in FIG. 2 adjacent to the active region a1, ferroelectric capacitors for the two transistors are disposed. The ferroelectric capacitor cf1 is connected to the drain region d2 of the corresponding adjacent transistor. Although not shown in FIG. 2, another ferroelectric capacitor is disposed at the left area of the active region a1, and connected to the drain region d1 of the other transistor.

The plate line p1 connected to the lower electrode of the ferroelectric capacitor is connected to the lower electrodes of a plurality of other ferroelectric capacitors.

Next, the second embodiment will be described.

Figure 3:
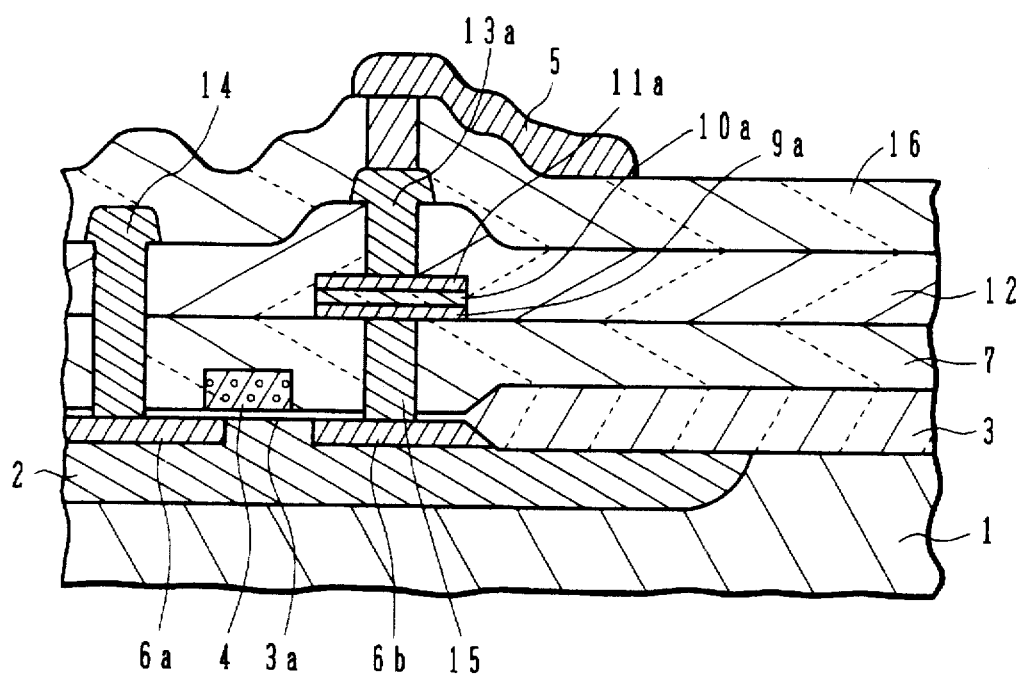
FIG. 3 is a cross sectional view of a memory cell according to a second embodiment of the invention.

FIG. 3 is a cross sectional view of a memory cell according to the second embodiment. The different points from the first embodiment reside in that a ferroelectric capacitor is formed over the transistor active region and the plate line is formed as a higher level layer than the ferroelectric capacitor.

With reference to FIG. 3, the memory cell structure and the manufacture method according to the second embodiment will be described.

First, in a surface layer of a semiconductor substrate 1, a well region 2 is formed. An active region is defined on the surface of the well region 2 by a field oxide film 3. In this active region, a transistor is formed having a source region 6a, a drain region 6b, and a gate electrode 4 formed on a gate oxide film 3a.

An interlevel insulating film 7 is formed covering the transistor and the field oxide film 3. In the interlevel insulating film 7, a connection hole exposing the surface of the drain region is formed, and the contact hole is buried with a W plug 15.

The surface of the interlevel insulating film 7 including the W plug 15 is planarized by CMP or the like. On the planarized surface, a Pt film, a PZT film, and a Pt film are sequentially laminated in this order. Since the underlying layer is not irregular, the PZT film formed even by a sol-gel method has a uniform film thickness.

By using one resist pattern as an etching mask, three layers of Pt film, PZT film, and Pt film are etched at a time to form a ferroelectric capacitor having a lower electrode 9a, a ferroelectric layer 10a, and an upper electrode 11a.

The drain region 6b of the transistor and the lower electrode 9a are being electrically connected by the W plug 15 burying the connection hole.

As different from the first embodiment, the ferroelectric capacitor is formed over the transistor region with the interlevel insulating film 7 being interposed. The ferroelectric capacitor formed over the transistor region reduces the area occupied by a memory cell and the integration density of memory can be improved.

Another interlevel insulating film 12 is formed covering the ferroelectric capacitor. The source region 6a of the transistor is connected to the bit line 14 via a connection hole formed in the interlevel insulating films 7 and 12. The bit line 14 interconnects the source regions of a plurality of other transistors, similar to FIG. 1H.

In the interlevel insulating film 12, a connection hole is formed exposing a partial surface area of the upper electrode 11a of the ferroelectric capacitor. A wiring pattern 13a burying this contact hole is formed.

Another interlevel insulating film 16 is formed covering the bit line 14, wiring pattern 13a, and other areas. In this interlevel insulating film 16, a connection hole is formed exposing a partial surface area of the wiring pattern 13a. On the interlevel insulating film 16, a plate line 5 is formed being connected via the connection hole to the wiring pattern 13a. The plate line 5 extends in the direction perpendicular to the drawing sheet, and electrically interconnects the upper electrodes of a plurality of ferroelectric capacitors. Alternatively, a connection hole passing through the interlevel insulating films 12 and 16 may be formed by one etching process.

The bit line 14 and plate line 5 are both used for connecting a plurality of memory cells and they cross at a number of areas on the substrate. It is therefore necessary to electrically isolate them by an interlevel insulating film or the like. The interlevel insulating film 16 is provided for this purpose. The plate line 5 may be formed on the surface of the interlevel insulating film 12, and a bit line connected to the source region 6a may be formed on the surface of the interlevel insulating film 16.

The plate line 5 may be made of the same material such as Ti/Al as the bit line 14 connected to the source region of the transistor.

In both of the first and second embodiments described above, the plate line is formed independently from the upper and lower electrodes of the ferroelectric capacitor. Therefore, the electrode pattern can be determined independently from the pattern of the plate line. If the three layers of a pair of electrodes and a ferroelectric layer constituting the ferroelectric capacitor are made to have the same plan shape, these three layers can be successively etched by using a single etching mask. The interfaces between respective layers of the ferroelectric capacitor are not exposed during the resist film patterning process or etching process, and so the clean surface is maintained. Therefore, a good adhesive force at each interface can be retained and the polarization property of the ferroelectric capacitor can be prevented from being degraded by contamination of each interface.

In both the embodiments, a ferroelectric capacitor is formed on a planarized interlevel insulating film. Since the underlying surface is not irregular, the thickness of the ferroelectric layer formed even by a sol-gel method is made uniform. Fluctuation of the characteristics of a ferroelectric capacitor to be otherwise caused by irregular film thickness can be avoided.

In the first embodiment, the lower electrode of the ferroelectric capacitor is not directly connected to the drain region 6b of the transistor. Therefore, charges generated during patterning the ferroelectric capacitor by ion milling or plasma etching will not enter the transistor. Degradation of the transistor characteristics by entered charges can therefore be avoided.

The present invention has been described in connection with the preferred embodiments. The invention is not limited only to the above embodiments. For example, the type of transistor of a memory cell is not limited to an n-channel MOS transistor, but a p-channel MOS transistor may be formed instead by exchanging the impurity conductivity type used by the above-described manufacture methods. The gate oxide film may be other films. For example, a nitride film may be used to form a MIS transistor.

Although PZT is used as the material of the ferroelectric layer, other materials may be used. For example, a barium titanate ($BaTiO_3$) film, a strontium barium titanate ($Ba_xSr_{1-x}TiO_3$) film, or the like may also be used. Other methods different from a sol-gel method, such as sputtering and MOCVD may be used for forming a ferroelectric layer.

It is apparent to those skilled in the art that various modifications, improvements, combinations and the like can be made within the spirit and scope of the present invention.

I claim:

1. A semiconductor storage device comprising:

a substrate with a semiconductor surface;

a transistor including a gate insulating film formed on the semiconductor surface, a gate electrode on said gate insulating film, and a pair of source and drain regions in the semiconductor surface sandwiching said gate electrode;

a ferroelectric capacitor including a first electrode, a ferroelectric layer, and a second electrode laminated in this order on said substrate, said first electrode, said ferroelectric layer, and said second electrode being of a same shape; and connection means for electrically connecting one of said first and second electrodes to one of said source and drain regions.

2. A semiconductor storage device according to claim 1, further comprising:

a field insulating film surrounding the semiconductor surface of said substrate;

a plate line disposed on said field insulating film and made of the same conductive layer as said gate electrode; and an interlevel insulating layer having a first flat surface and covering said transistor and said plate line, wherein said ferroelectric capacitor is disposed on the first flat surface of said interlevel insulating layer.

3. A semiconductor storage device according to claim 2, further comprising:

a first connection hole formed through said interlevel insulating layer for exposing said plate line; and a connection member having a second flat surface flush with said first flat surface for burying said first connection hole and electrically connecting said plate line and said first electrode together, wherein said one of said first and second electrodes is said second electrode.

4. A semiconductor storage device according to claim 1, wherein said first and second electrodes are made of Pt or Au.

5. A semiconductor storage device according to claim 3, further comprising:

an upper insulating layer on said interlevel insulating layer, covering said ferroelectric capacitor;

a second connection hole through said upper insulating layer for exposing said second electrode; and a third connection hole through said upper insulating layer and said interlevel insulating layer for exposing one of said source and drain regions, wherein said connection means includes a conductive member for burying said second and third connection holes, said conductive member being connected on the surface of said upper insulating layer.

6. A semiconductor storage device according to claim 1, further comprising:

a first interlevel insulating layer having a first flat surface and being on the semiconductor surface, covering said transistor; and a first connection hole through said first interlevel insulating layer for exposing one of said source and drain regions, wherein said connection means includes a first connection member having a second flat surface flush with said first flat surface for burying said first connection hole, and said first electrode is disposed on said second flat surface and said first flat surface at the peripheral area of said second flat surface.

7. A semiconductor storage device according to claim 6, further comprising:

a multi-layer second interlevel insulating layer on said first flat surface, covering said ferroelectric capacitor;

a second connection hole and a third connection hole through said first and second interlevel insulating layers and reaching the other of said source and drain regions and said second electrode; and a wiring pattern having two conductive members burying said second and third connection holes.

8. A semiconductor storage device comprising:

a substrate with a surface including a plurality of semiconductor regions and an insulating region surrounding each of the plurality of semiconductor regions;

a plurality of transistors each in said semiconductor region in said substrate surface and having a gate insulating film on said substrate surface, a gate electrode on said gate insulating film, a pair of a source region and a drain region in said semiconductor region at both sides of said gate electrode;

a plurality of ferroelectric capacitors in a matrix array each connected to an associated one of said transistors and having a first electrode, a ferroelectric layer, and a second electrode laminated in this order on said substrate surface, said first electrode, said ferroelectric layer, and said second electrode having the same shape, and one of said first and second electrodes being connected to one of said source and drain regions;

a plate line for connecting the others of said first and second electrodes of the plurality of ferroelectric capacitors for each row;

a bit line for connecting the others of said source and drain electrodes of the plurality of transistors for each row; and a word line for connecting the gate electrodes of the plurality of transistors for each column.

9. A semiconductor storage device according to claim 8, wherein said plate line is disposed on said insulating region and formed by the same conductive layer as said gate electrode.

10. A semiconductor storage device according to claim 8, wherein said first and second electrodes are made of Pt or Au.

11. A semiconductor storage device according to claim 8, further comprising an interlevel insulating layer having a first flat surface on said substrate surface covering said transistor and said plate line, wherein said ferroelectric capacitor is disposed on said first flat surface.

12. A semiconductor storage device according to claim 11, further comprising:

a first connection hole through said interlevel insulating layer for exposing said plate line; and a connection member having a second flat surface flush with said first flat surface for burying said first connection hole and electrically connecting said plate line and said first electrode together, wherein said one of said first and second electrodes is said second electrode.

13. A semiconductor storage device according to claim 8, wherein the interfaces between said ferroelectric layer and said first and second electrodes are generally flat.

14. A semiconductor storage device according to claim 12, wherein the interfaces between said ferroelectric layer and said first and second electrodes are generally flat.

15. A semiconductor storage device according to claim 12, wherein said plate line interconnects the first electrodes of the plurality of capacitors.

16. A semiconductor storage device comprising:

a substrate with a semiconductor surface;

a transistor including a gate insulating film on the semiconductor surface, a gate electrode on said gate insulating film, and a pair of source and drain regions in the semiconductor surface sandwiching said gate electrode;

a ferroelectric capacitor including a first electrode, a ferroelectric layer, and a second electrode laminated in this order on said substrate, said first electrode, said ferroelectric layer, and said second electrode being of a same shape; and a connector electrically connecting one of said first and second electrodes to one of said source and drain regions.

* * * * *